(12) United States Patent
Ueyama et al.

(10) Patent No.: US 6,311,385 B1
(45) Date of Patent: Nov. 6, 2001

(54) HIGH TEMPERATURE OXIDE SUPERCONDUCTING WIRE AND METHOD OF MANUFACTURING THEREOF

(75) Inventors: Munetsugu Ueyama; Kazuhiko Hayashi, both of Osaka (JP)

(73) Assignee: Sumitomo Electric Industries, Inc., Osaka (JP)

( * ) Notice: Subject to any disclaimer, the term of this patent is extended or adjusted under 35 U.S.C. 154(b) by 0 days.

(21) Appl. No.: 09/264,570

(22) Filed: Mar. 8, 1999

(30) Foreign Application Priority Data

Apr. 28, 1998 (JP) .................................................. 10-119093

(51) Int. Cl.$^7$ .................................................. H01L 39/24
(52) U.S. Cl. ............................ 29/599; 505/739; 505/740; 505/741
(58) Field of Search ............................... 29/599; 505/739, 505/740, 741

(56) References Cited

U.S. PATENT DOCUMENTS 5,232,908 * 8/1993 Shiga et al. ............................... 29/599
6,066,599 * 5/2000 Otto et al. ............................... 29/599

FOREIGN PATENT DOCUMENTS

| 0 867 950 | 9/1998 | (EP) . |
|---|---|---|
| 2-220809 * | 9/1990 | (JP) . |
| 3-15116 | 1/1991 | (JP) . |
| 10-50152 | 2/1998 | (JP) . |
| 11-7846 | 1/1999 | (JP) . |
| 96/28853 | 9/1996 | (WO) . |
| 98/13859 | 4/1998 | (WO) . |

* cited by examiner

*Primary Examiner*—Carl J. Arbes
(74) *Attorney, Agent, or Firm*—Foley & Lardner

(57) ABSTRACT

A high temperature oxide superconducting wire is provided which is capable of preventing metal located on the outer periphery of the superconducting wire from diffusing into a superconductor to achieve restriction of reduction in the critical current density. The high temperature oxide superconducting wire includes a high temperature oxide superconductor 1, a sheathing body 2 formed of material containing silver for coating the high temperature oxide superconductor 1, a heat-resistant oxide ceramic material 3 for coating the sheathing body 2, and a coating body 4 mwhich is inactive relative to the heat-resistant oxide ceramic material 3 in a high temperature oxidative atmosphere.

38 Claims, 4 Drawing Sheets

100 # HIGH TEMPERATURE OXIDE SUPERCONDUCTING WIRE AND METHOD OF MANUFACTURING THEREOF

BACKGROUND OF THE INVENTION

1. Field of the Invention

The present invention relates to high temperature oxide superconducting wires and methods of manufacturing such wires, and more particularly to a high temperature oxide superconducting wire and a method of manufacturing thereof used in such applications as electric power, transportation, high energy, and medical treatment.

2. Description of the Background Art

It has been reported recently that a sintered body of oxide exhibits superconductivity at a high critical temperature, and the technique for superconduction employing such a superconductor is being into practical use. The yttrium-based oxide and the bismuth-based oxide are reported respectively to exhibit the phenomenon of superconduction at 90K and 110K. Such oxide superconductors are expected to be into practical use since they exhibit superconducting properties in liquid nitrogen which is available at a relatively low cost.

In order to transfer alternating current for supplying power, for example, through such superconductors, a superconducting wire formed by coating a superconductor with a silver sheath, coating the silver sheath with an insulator (high-resistant body) and further coating the insulator with metal is employed.

The superconductor is coated with the silver sheath for preventing the crystal structure of the superconductor from being destroyed in the drawing process. The silver sheath is coated with the insulator for reducing the ac loss. The insulator is coated with the metal for providing the superconducting wire with flexibility required.

Superconducting wires having such a structure as set forth above are disclosed in, for example, International Publication No. WO96/28853 and Japanese Patent Laying-Open No. 10-50152.

According to a method disclosed in WO096/28853, a superconductor is surrounded on its periphery by silver or the like, and further surrounded on its periphery by metal. The metal is then oxidized to produce an insulator formed of metal oxide between the silver and metal.

According to a method disclosed in Japanese Patent Laying-Open No. 10-50152, a superconductor is surrounded by silver, and further surrounded on its periphery by electrically resistant alloy (high-resistant body). The resistant alloy is oxidized to produce an insulating oxide between the silver and the resistant alloy.

According to those techniques disclosed in the two publications described above, the metal is oxidized to form the insulating oxide. The oxidation allows the metal to diffuse into the superconductor and accordingly the crystal structure of the superconductor changes. A problem of decrease in the critical current density of the superconducting wire then arises.

SUMMARY OF THE INVENTION

The present invention is made to solve such a problem as described above. One object of the present invention is to provide a high temperature oxide superconducting wire in which metal located on the outer periphery of the superconducting wire does not diffuse into a superconductor to prevent reduction in the critical current density, and a method of manufacturing such a superconducting wire.

According to one aspect of the invention, a high temperature oxide superconducting wire includes a high temperature oxide superconductor, a sheathing body, a high-resistant body, and a coating body. The sheathing body is formed of a material containing silver to coat the high temperature oxide superconductor. The high-resistant body is formed of a material containing a heat-resistant oxide ceramics to coat the sheathing body. The coating body is formed of a material which is inactive relative to the high-resistant body in a high temperature oxidative atmosphere to coat the high-resistant body.

In the high temperature oxide superconducting wire having such a structure, the high-resistant body and the coating body are inactive relative to each other in the high temperature oxidative atmosphere, that is, the high-resistant body and the coating body are difficult to react with each other in that atmosphere. Consequently, it is possible to prevent the material constituting the coating body from diffusing into the high temperature oxide superconductor in a heat treatment process. The crystal structure of the high temperature oxide superconductor does not change and reduction in the critical current density can be restricted.

Preferably a plurality of sheathing bodies are provided and the high-resistant bodies are interposed between the plurality of sheathing bodies respectively. Accordingly, the ac loss can be decreased when alternating current is transferred.

The high temperature oxide superconductor is preferably in the shape of filament.

The heat-resistant oxide ceramics is preferably a ceramic material which is stable in an oxidative atmosphere of at least 800° C.

Preferably the heat-resistant oxide ceramics includes at least one selected from the group consisting of $Al_2O_3$, MgO, CoO, $Co_3O_4$, $SiO_2$, $Bi_2Sr_2CuOx$ and $(Sr, Ca)_2CuO_3$.

The material constituting the coating body preferably includes at least one selected from the group consisting of silver, silver alloy, oxide-dispersed silver, stainless steel, and nickel alloy. "Oxide-dispersed silver" herein refers to the metal silver in which oxide grains are dispersed.

Preferably the silver alloy includes at least one selected from the group consisting of Ag—Mg alloy, Ag—Mn alloy, Ag—Au alloy, Ag—Sb alloy, and Ag—Pd alloy.

Preferably the oxide-dispersed silver is formed of silver in which oxide grains including at least one selected from the group consisting of $Al_2O_3$, MgO, $Mn_2O_3$ and $Li_2O$ are dispersed. The oxide-dispersed silver is represented as [Ag—$Al_2O_3$] that refers to metal silver in which alumina ($Al_2O_3$) grains are uniformly dispersed. This representation is hereinafter similarly employed.

Preferably the stainless steel is SUS304 (Japanese Industrial Standard or SUS310 (Japanese Industrial Standard).

Preferably the nickel alloy is Ni—Cr—Fe alloy.

Preferably conductive metal is added to the heat-resistant oxide ceramics.

Preferably the conductive metal includes at least one selected from the group consisting of silver, silver alloy, gold, and gold alloy.

The material forming the sheathing body preferably includes at least one selected from the group consisting of Ag, Ag—Au alloy and Ag—Sb alloy.

The high temperature oxide superconductor is preferably Bi (Pb)—Sr—Ca—Cu—O-based high temperature superconductor.

Preferably such a high temperature oxide superconducting wire as described above is a high temperature oxide superconducting current lead.

According to one aspect of the present invention, a method of manufacturing a high temperature oxide superconducting wire includes the steps of filling a first pipe formed of a material containing silver with raw powder which becomes a high temperature oxide superconductor by a heat treatment or with powder of a high temperature oxide superconductor, placing the first pipe filled with the raw powder or the powder of the high temperature oxide superconductor in a second pipe, filling a space between an outer surface of the first pipe and an inner surface of the second pipe with heat-resistant oxide ceramic powder. The second pipe is formed of a material which is inactive relative to the heat-resistant oxide ceramic powder in a high temperature oxidative atmosphere. The method of manufacturing the high temperature oxide superconducting wire further includes a step of applying a plastic working and a heat treatment to the second pipe filled with the heat-resistant oxide ceramic powder.

According to the method of manufacturing the high temperature oxide superconducting wire following those steps, since the second pipe is inactive relative to the heat-resistant oxide ceramic powder in the high temperature oxidative atmosphere, that is, the second pipe is difficult to react with the ceramic powder in that atmosphere, the material constituting the second pipe is never diffused into the raw powder or the powder of the high temperature oxide superconductor within the first pipe through the heat-resistant oxide ceramic powder in the heat treatment. Accordingly, the composition of the raw powder or the powder of the high temperature oxide superconductor does not change and restriction of reduction in the critical current density is possible.

Preferably, the average grain size of the heat-resistant oxide ceramic powder is 10 $\mu$m or less, and the average grain size thereof is more preferably 1 $\mu$m or less.

Preferably conductive metal is evaporated to be deposited on the surface of the heat-resistant oxide ceramic powder. Conductive metal powder is preferably mixed with the heat-resistant oxide ceramic powder.

The step of applying the plastic working and the heat treatment to the second pipe preferably includes a step of applying a compressing process and a heat treatment to the second pipe which has been subjected to a twisting process.

The step of applying the plastic working and the heat treatment to the second pipe preferably includes a step of applying a drawing or twisting process to the second pipe to produce a plurality of wires, and bundling the plurality of wires to be subjected to a twining process and further subjected to compressing and heat treatment.

The step of filling the first pipe with the raw powder or the powder of the high temperature oxide superconductor preferably includes a step of preparing a plurality of first pipes and filling the plurality of first pipes respectively with the raw powder or the powder of the high temperature oxide superconductor.

According to another aspect of the present invention, a method of manufacturing a high temperature oxide superconducting wire includes the steps of filling a first pipe formed of a material containing silver with raw powder which becomes a high temperature oxide superconductor by a heat treatment or powder of a high temperature oxide superconductor, preparing a powder compact having a hole from heat-resistant oxide ceramic powder, inserting the first pipe filled with the raw powder or the powder of the high temperature oxide superconductor into the hole of the powder compact, and placing the powder compact having the first pipe inserted therein in a second pipe. The second pipe is formed of a material which is inactive relative to the heat-resistant oxide ceramic powder in a high temperature oxidative atmosphere. The method of manufacturing the high temperature oxide superconducting wire further includes a step of applying a plastic working and a heat treatment to the second pipe in which the powder compact is placed.

According to the method of manufacturing the high temperature oxide superconducting wire following those steps, since the second pipe is inactive relative to the heat-resistant oxide ceramic powder in the high temperature oxidative atmosphere, that is, the second pipe is difficult to react with the ceramic powder in that atmosphere, the material constituting the second pipe is never diffused into the raw powder or the powder of the high temperature oxide superconductor within the first pipe through the heat-resistant oxide ceramic powder in the heat treatment. Accordingly, the composition of the raw powder or the powder of the high temperature oxide superconductor does not change and restriction of reduction in the critical current density is possible.

Preferably the average grain size of the heat-resistant oxide ceramic powder is equal to 10 $\mu$m or less, and the average grain size is more preferably equal to 1 $\mu$m or less.

Preferably conductive metal is evaporated to be deposited on the surface of the heat-resistant oxide ceramic powder. Preferably conductive metal powder is mixed with the heat-resistant oxide ceramic powder.

Preferably the step of applying the plastic working and the heat treatment to the second pipe includes a step of applying, after application of a twisting process to the second pipe, a compressing process and a heat treatment to the second pipe.

The step of applying the plastic working and the heat treatment to the second pipe preferably includes a step of applying a drawing or twisting process to the second pipe to produce a plurality of wires, bundling the plurality of wires, applying a twining process and further applying a compressing process and a heat treatment to the wires.

Preferably the step of filling the first pipe with the raw powder or the powder of the high temperature oxide superconductor includes a step of preparing a plurality of first pipes, and filling the plurality of first pipes respectively with the raw powder or the powder of the high temperature oxide superconductor.

According to still another aspect of the present invention, a method of manufacturing a high temperature oxide superconducting wire includes the steps of filling a first pipe formed of a material containing silver with raw powder which becomes a high temperature oxide superconductor by a heat treatment or powder of a high temperature oxide superconductor, and attaching heat-resistant oxide ceramic powder onto a surface of a metal plate to produce a plate-shaped body. The metal plate is formed of a material which is inactive relative to the heat-resistant oxide ceramic powder in a high temperature oxidative atmosphere. The method of manufacturing the high temperature oxide superconducting wire further includes a step of winding the plate-shaped body around the first pipe filled with the raw powder or the powder of the high temperature oxide superconductor to place the resultant one in a second pipe. The second pipe is formed of a material which is inactive relative to the heat-resistant oxide ceramic powder in the high temperature oxidative atmosphere. The method of manufacturing the high temperature oxide superconducting wire further includes a step of applying a plastic working and a heat treatment to the second pipe in which the plate-shaped body is placed.

According to the method of manufacturing the high temperature oxide superconducting wire following those steps, since the materials constituting the metal plate and the second pipe are both inactive relative to the heat-resistant oxide ceramic powder in the high temperature oxidative atmosphere, that is, the materials are difficult to react with the ceramic powder in that atmosphere, the material forming the metal plate and the material forming the second pipe are never diffused into the raw powder or the powder of the high temperature oxide superconductor in the first pipe through the heat-resistant oxide ceramic powder in the heat treatment. As a result, the composition of the raw powder or the powder of the high temperature oxide superconductor never change and reduction in the critical current density can be restricted.

Preferably the average grain size of the heat-resistant oxide ceramic powder is equal to or less than 10 μm, and more preferably the average grain size is equal to or less than 1 μm.

Preferably conductive metal is evaporated and deposited on the surface of the heat-resistant oxide ceramic powder. Preferably conductive metal powder is mixed with the heat-resistant oxide ceramic powder.

The step of applying the plastic working and the heat treatment to the second pipe preferably includes a step of applying a twisting process and thereafter applying a compressing process and a heat treatment to the second pipe.

The step of applying the plastic working and the heat treatment to the second pipe preferably includes a step of applying a drawing or twisting process to the second pipe to produce a plurality of wires, bundling the plurality of wires, applying a twining process to the wires, and further applying a compressing process and a heat treatment thereto.

The step of filling the first pipe with the raw powder or the powder of the high temperature oxide superconductor preferably includes a step of preparing a plurality of first pipes and filling the plurality of first pipes respectively with the raw powder or the powder of the high temperature oxide superconductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

$Bi_2O_3$, PbO, $SrCO_3$, $CaCO_3$ and CuO were mixed to obtain powder having a composition ratio (atomic ratio) of Bi:Pb:Sr:Ca:Cu=1.8:0.4:2.0: 2.0:3.0. The obtained powder was heat treated for 12 hours at 700° C. and thereafter ground by a ball mill. The ground powder was heat treated for 8 hours at 800° C. and thereafter ground by the ball mill. The ground powder was heat treated for 4 hours at 850° C. and thereafter ground by the ball mill.

After the powder obtained by the grinding was heat treated for 2 hours at 800° C for deaeration, a silver pipe as a first pipe having an outer diameter of 25 mmφ and an inner diameter of 22 mmφ was filled with the powder. The silver pipe filled with the powder was drawn to have the outer diameter of 20 mmφ. A silver pipe as a second pipe having an outer diameter of 23 mmφ and an inner diameter of 22 mmφ was filled with the drawn wire together with ceramic powder having an average grain size of 1 μs a high-resistant body shown in Table 1. The silver pipe was drawn to have the outer diameter of 1.44 mmφ and a wire is obtained. The resultant wire was cut into 61 wires, the 61 wires were bundled to be fit in a silver pipe as a third pipe having an outer diameter of 14 mmφ and an inner diameter of 13 mmφ, and the pipe was drawn to have an outer diameter of 1.25 mmφ. The resultant wire was rolled to have a thickness of 0.25 mm to obtain a tape-shaped wire. The wire was heat treated for 50 hours at 845° C. and cooled to the room temperature, subjected to a rolling process to have a thickness of 0.22 mm, and thereafter heat treated for 50 hours at 840° C. to obtain a high temperature oxide superconducting wire.

The ceramic powder in the obtained high temperature oxide superconducting wire was removed to measure the critical current density thereof by the dc four-probe method in liquid nitrogen. The result of the measurement is shown by Table 1.

TABLE 1

| Sample No. | Ceramic Powder | Critical Current Density (A/cm$^2$) |
|---|---|---|
| 1 | None | 35,000 |
| 2 | Zirconium Oxide ($ZrO_2$) | 17,000 |
| 3 | Manganese Oxide ($Mn_2O_3$) | 18,000 |
| 4 | Silicon Nitride ($Si_3N_4$) | 5,000 |
| 5 | Silicon Carbide (SiC) | 3,000 |
| 6 | Yttrium Oxide Stabilizing Zirconia (YSZ) | 2,000 |
| 7 | Aluminum Oxide ($Al_2O_3$) | 36,000 |
| 8 | Magnesium Oxide (MgO) | 35,000 |
| 9 | Silicon Oxide ($SiO_2$) | 33,000 |
| 10 | Cobalt Oxide (CoO) | 35,000 |
| 11 | Cobalt Tetraoxide ($Co_3O_4$) | 34,500 |
| 12 | $(Sr, Ca)_2CuO_3$ | 34,000 |
| 13 | $Bi_2Sr_2CuO_X$ | 35,500 |

According to Table 1, it can be seen that the critical current density is especially high when the aluminum oxide or the magnesium oxide is used the high-resistant body. Further, the ac loss was measured for Samples 1 and 7. The ac loss for Sample 7 was ⅒ or less the ac loss for Sample 1.

Figure 1:
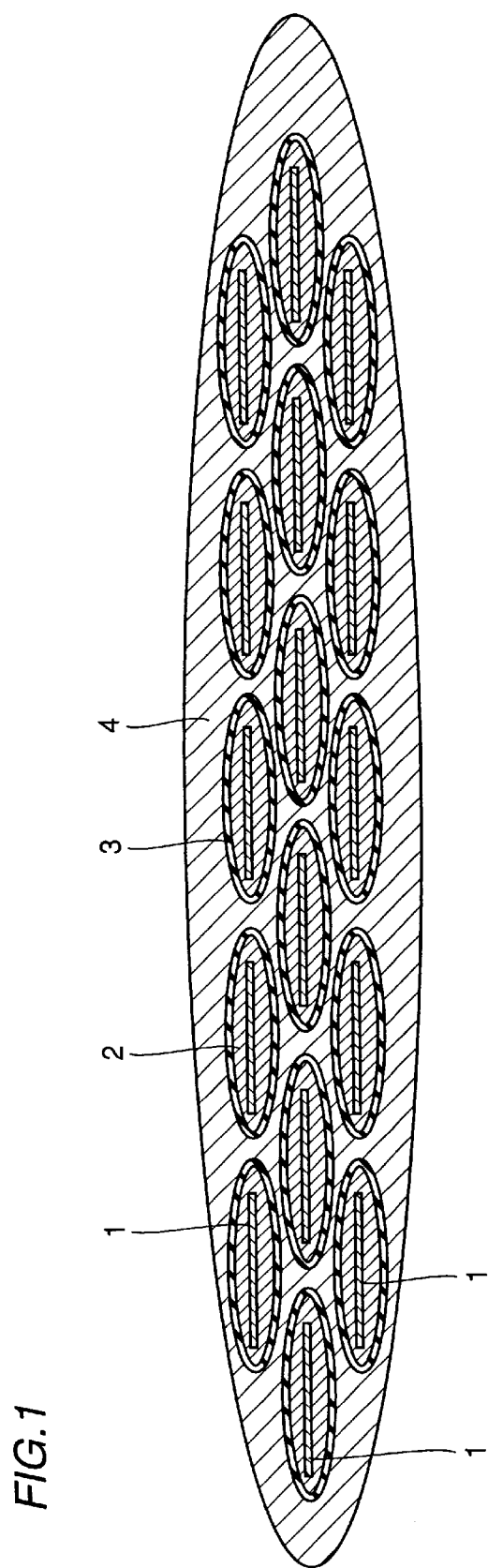
FIG. 1 illustrates a cross section of Sample 7 in Example 1.

Referring to FIG. 1, a bismuth-based high temperature oxide superconductor 1 was coated with a sheathing body 2 formed of silver. Sheathing body 2 was coated with heat-resistant oxide ceramics 3 ($Al_2O_3$). Heat-resistant oxide ceramics 3 was coated with a coating body 4 formed of

EXAMPLE 2

In Example 1, the silver pipe with the outer diameter of 25 mmφ and the inner diameter of 22 mmφ was used as the first pipe. According to Example 2, a silver alloy pipe having a composition shown in Table 2 and an outer diameter of 25 mmφ and an inner diameter of 22 mmφ was used as the first pipe. The high-resistant body was aluminum oxide with an average grain size of 0.8 μm in Example 2 while various high-resistant bodies were used in Example 1. All of the other steps of Example 2 were the same as those of Example 1.

The critical current density of a high temperature oxide superconducting wire obtained by the steps accordingly was measured in the same manner as that of Example 1. The result thus obtained is shown by Table 2.

TABLE 2

| Sample No. | First Pipe | Critical Current Density (A/cm$^2$) |
|---|---|---|
| 21 | Ag | 36,000 |
| 22 | Ag-10 at % Mg | 5,000 |
| 23 | Ag-10 at % Au | 34,000 |
| 24 | Ag-0.5 at % Sb | 36,000 |

Ag-10 at % Mg in Table 2 shows that the ratio of the number of magnesium atoms accounts for 10% of the total atoms. Reduction of the critical current density due to a large amount of added magnesium to Sample 22 can be understood from Table 2.

EXAMPLE 3

According to Example 3, magnesium oxide (MgO) having an average grain size of 1.2 μm was used as ceramic grains, and various materials for the second and third pipes were used to measure the critical current density of a superconducting wire.

Specifically, mixed powder of $Bi_2O_3$, PbO, $SrCO_3$, $CaCO_3$ and CuO having the same composition as that of Example 1 was prepared. A silver pipe as the first pipe similar to that of Example 1 was filled with the mixed powder and the pipe was drawn to have an outer diameter of 20 mmφ. A second pipe having a composition shown in Table 3 and having an outer diameter of 23 mmφ and an inner diameter of 22 mm φ was filled with the drawn silver pipe and powder of magnesium oxide with an average grain size of 1.2 μm, and drawn to have an outer diameter of the pipe of 1.44 mmφ to produce a wire. The obtained wire was cut into 61 wires, the 61 wires were bundled to be fit in a third pipe having a composition shown in Table 3 and an outer diameter of 14 mmφ and an inner diameter of 13 mmφ, and a resultant pipe was drawn to have an outer diameter of 1.25 mmφ. The resultant wire was heat treated and rolled in a similar manner to that of Example 1 and thus a superconducting wire was prepared. The critical current density of the superconducting wire was measured in a manner similar to that of Example 1. The result thus obtained is shown by Table 3.

TABLE 3

| Sample No. | Second and Third Pipes | Critical Current Density (A/cm$^2$) |
|---|---|---|
| 31 | Ag | 34,000 |
| 32 | Cu | 1,000 |
| 33 | Ni | 1,500 |
| 34 | Ag-5 at % Mg | 33,000 |
| 35 | Ag-2 at % Mn | 35,000 |
| 36 | Ag-10 at % Au | 34,000 |
| 37 | Ag-0.6 at % Sb | 36,000 |
| 38 | Ag-0.1 at % Pd | 32,000 |
| 39 | [Ag—$Al_2O_3$] | 34,000 |
| 40 | [Ag—MgO] | 36,000 |

TABLE 3-continued

| Sample No. | Second and Third Pipes | Critical Current Density (A/cm$^2$) |
|---|---|---|
| 41 | [Ag—$Mn_2O_3$] | 35,500 |
| 42 | [Ag—$Li_2O$] | 33,000 |
| 43 | SUS304 | 35,000 |
| 44 | SUS310 | 34,000 |
| 45 | Inconel 600 | 36,000 |
| 46 | Incoloy | 32,000 |

Referring to Table 3, "inconel 600" of Sample 45 represents alloy having its composition of Ni:Fe:Cr:Cu= 0.758:0.08:0.16:0.002 as the atomic ratio, and "incoloy" of Sample 46 represents alloy having a composition of Ni:Fe:Cr:=0.34:0.46:0.2 as an atomic ratio. Reduction in the critical current density of Samples 32 and 33 can be seen from Table 3.

EXAMPLE 4

According to Example 4, conductive metal powder was added to the ceramic powder used in Example 1 to prepare a sample.

Specifically, in the step of filling the second pipe with the ceramic powder according to Example 1, the second pipe was filled with powder obtained by mixing the ceramic powder shown in Table 4 with the conductive metal powder, and thereafter a superconducting wire was produced by the same method as that of Example 1 to obtain Samples 51–56. Concerning Samples 53–56, powder of conductive metals such as silver and gold was added to provide the surface of the wire and the central superconducting filament portion with conductivity. Therefore, the critical current density was measured in the liquid nitrogen by the dc four-probe method without removing the ceramic powder as heat-resistant oxide ceramics. Concerning Samples 51 and 52, ceramic powder was removed to measure the critical current density by the dc four-probe method in the liquid nitrogen. The result of the measurement is shown by Table 4.

TABLE 4

| Sample No. | Ceramic Powder | Conductive Metal Powder | Critical Current Density (A/cm$^2$) |
|---|---|---|---|
| 51 | Aluminum Oxide ($Al_2O_3$) | None | 34,500 |
| 52 | Magnesium Oxide (MgO) | None | 35,500 |
| 53 | Aluminum Oxide ($Al_2O_3$) | Ag | 35,000 |
| 54 | Aluminum Oxide ($Al_2O_3$) | Au | 34,000 |
| 55 | Magnesium Oxide (MgO) | Ag | 36,000 |
| 56 | Magnesium Oxide (MgO) | Au | 35,000 |

Ceramic powder was removed for measuring Samples 51 and 52.

It can be seen from Table 4 that the critical current density does not decrease even if the conductive metal powder is added.

Figure 2:
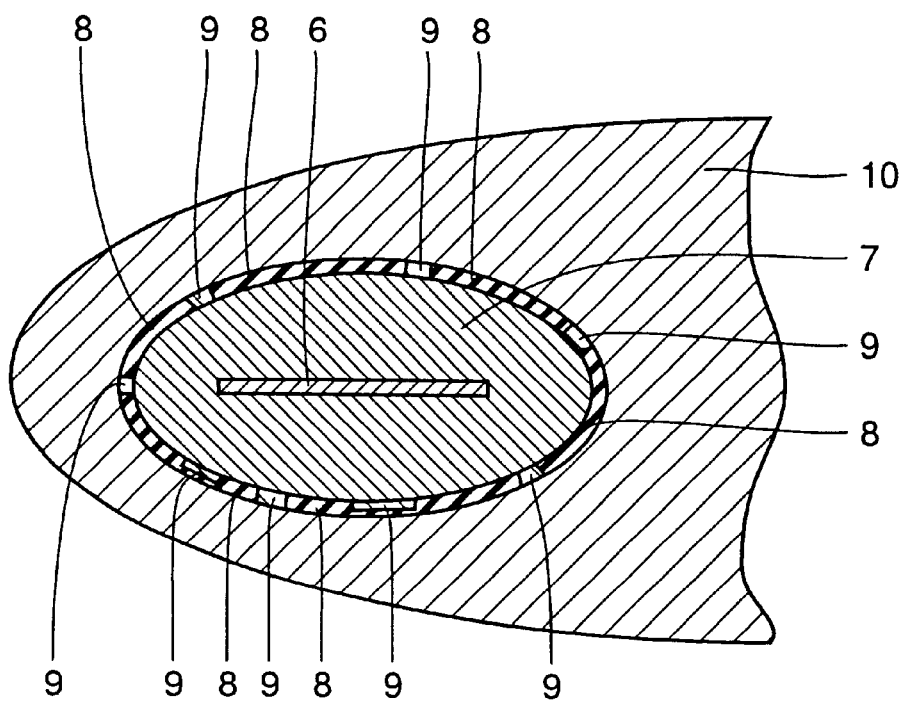
FIG. 2 illustrates a cross section of Sample 53 in Example 4.

Referring to FIG. 2, a bismuth-based high temperature oxide superconductor 6 was coated with a sheathing body 7 formed of silver. Sheathing body 7 was coated with heat-resistant oxide ceramics 8 ($Al_2O_3$) and conductive metal powder 9. Heat-resistant oxide ceramics 8 and conductive metal powder 9 were coated with a coating body 10 formed of silver.

EXAMPLE 5

According to Example 5, gold or silver was evaporated and deposited on the surface of the alumina employed in Example 1 to prepare powder, and the second pipe was filled with this powder.

Specifically, in the step of filling the second pipe with the ceramic powder in Example 1, according to Example 5, the second pipe was filled with powder of aluminum oxide without deposited metal material or powder of aluminum oxide having metal material deposited thereon as shown in Table 5. Superconducting wires represented by Samples 61–63 were obtained following steps similar to those of Example 1.

Concerning Samples 62 and 63 thus obtained, the surface of the superconducting wire and the central superconducting filament portion were provided with conductivity similarly to the samples obtained in Example 4. Accordingly, the ceramic powder was not removed to measure the critical current density in the liquid nitrogen by the dc four-probe method. Concerning Sample 61, the ceramic powder was removed to measure the critical current density in the liquid nitrogen by the dc four-probe method. The result thus obtained is shown by Table 5.

TABLE 5

| Sample No. | Ceramic Powder | Deposited Metal Material | Critical Current Density (A/cm$_2$) |
| --- | --- | --- | --- |
| 61 | Aluminum Oxide ($Al_2O_3$) | None | 37,000 |
| 62 | Aluminum Oxide ($Al_2O_3$) | Ag | 36,500 |
| 63 | Aluminum Oxide ($Al_2O_3$) | Au | 36,000 |

Ceramic powder was removed for measuring Sample 61.

It can be seen from Table 5 that almost no reduction in the critical current density is observed even when the deposited metal material was used.

EXAMPLE 6

$Bi_2O_3$, PbO, $SrCO_3$, $CaCO_3$ and CuO were mixed to obtain powder having a composition ratio (atomic ratio) of Bi:Pb:Sr:Ca:Cu=1.8:0.4:2.0:2.0:3.0. The obtained powder was heat treated for 12 hours at 700° C. and thereafter ground by a ball mill. The ground powder was heat treated for 8 hours at 800° C. and thereafter ground by the ball mill. The ground powder was heat treated for 4 hours at 850° C. and thereafter ground by the ball mill.

The powder obtained by grinding was heat treated for 2 hours at 800° C. and thus deaerated. A silver pipe as a first pipe having an outer diameter of 25 mm$\phi$ and an inner diameter of 22 mm$\phi$ was filled with this powder, and the silver pipe filled with the powder was drawn to have an outer diameter of 1.30 mm$\phi$. A wire thus obtained by the drawing process was cut into 61 wires.

Ceramic powder as a high-resistant body having an average grain size of 0.8 $\mu$m and a composition shown in Table 6 was utilized to prepare a cylinder-shaped powder compact with an outer diameter of 12.9 mm$\phi$, and 61 holes having an inner diameter of 1.30 mm$\phi$ each were made in the powder compact. 61 wires obtained by the preceding step were respectively inserted into the holes. The powder compact having those wires inserted therein was inserted into a silver pipe as the second pipe having an outer diameter of 14 mm$\phi$ and an inner diameter of 13 mm$\phi$, and the silver pipe was drawn to have an outer diameter of 1.25 mm$\phi$. The silver pipe was further rolled to have a thickness of 0. 25 mm to obtain a tape-shaped wire.

The tape-shaped wire was heat treated for 50 hours at 845° C. and thereafter cooled to the room temperature. The tape-shaped wire was then rolled to have a thickness of 0.22 mm and thereafter heat treated for 50 hours at 840° C. to obtain a high temperature oxide superconducting wire.

The critical current density of the resultant wire was measured by the dc four-probe method after removing the ceramic powder in the wire. The result thus obtained is shown by Table 6.

TABLE 6

| Sample No. | Ceramic Powder | Critical Current Density (A/cm$^2$) |
| --- | --- | --- |
| 71 | None | 37,000 |
| 72 | Zirconium Oxide ($ZrO_2$) | 16,000 |
| 73 | Manganese Oxide ($Mn_2O_3$) | 14,000 |
| 74 | Silicon Nitride ($Si_3N_4$) | 2,000 |
| 75 | Silicon Carbide (SiC) | 1,000 |
| 76 | Yttrium Oxide Stabilizing Zirconia (YSZ) | 1,500 |
| 77 | Aluminum Oxide ($Al_2O_3$) | 35,000 |
| 78 | Magnesium Oxide (MgO) | 37,000 |
| 79 | Silicon Oxide ($SiO_2$) | 30,000 |
| 80 | Cobalt Oxide (CoO) | 35,500 |
| 81 | Cobalt Tetraoxide ($Co_3O_4$) | 36,000 |
| 82 | $(Sr, Ca)_2CuO_3$ | 36,500 |
| 83 | $Bi_2Sr_2CuO_X$ | 35,500 |

It can be seen from Table 6 that the critical current density does not decrease when the oxide ceramics is not used.

Figure 3:
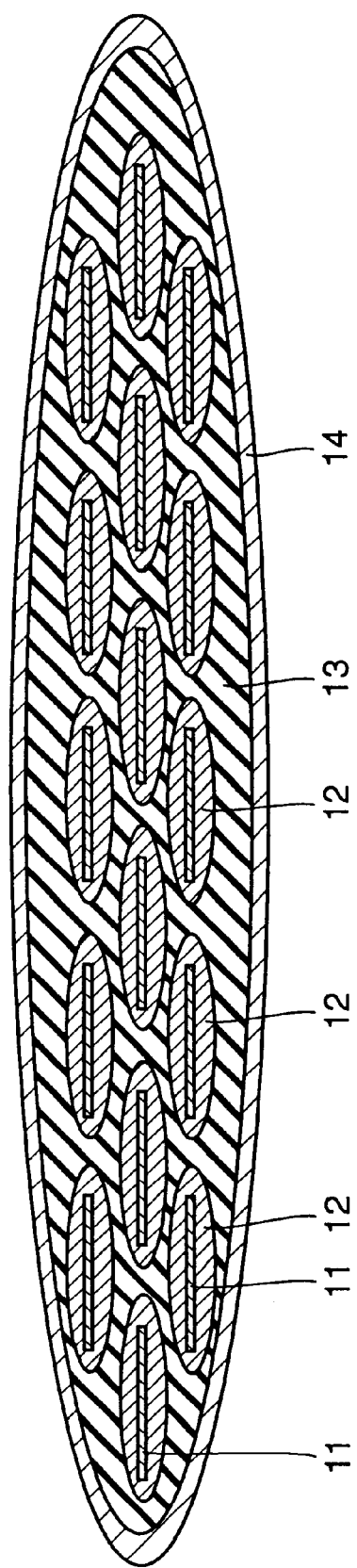
FIG. 3 illustrates a cross section of Sample 77 in Example 6.

Referring to FIG. 3, concerning Sample 77, a bismuth-based high temperature oxide superconductor 11 was coated with a sheathing body 12. Sheathing body 12 was coated with heat-resistant oxide ceramics 13 ($Al_2O_3$) as a high-resistant body. Heat-resistant oxide ceramics 13 was coated coating body 14 formed of silver.

EXAMPLE 7

$Bi_2O_3$, PbO, $SrCO_3$, $CaCO_3$ and CuO were mixed to obtain powder a composition ratio (atomic ratio) of Bi:Pb:Sr:Ca:Cu=1.8:0.4:2.0:2.0:3.0. The obtained powder was heat treated for 12 hours at 700° C. and thereafter ground by a ball mill. The ground powder was heat treated for 8 hours at 800° C. and thereafter ground by the ball mill. After the ground powder was heat treated for 4 hours at 850° C., the powder was ground by the ball mill.

After the powder obtained by the grinding process was heat treated for 2 hours at 800° C. for deaeration, a silver pipe as a first pipe with an outer diameter of 25 mm$\phi$ and an inner diameter of 22 mm$\phi$ was filled with the resultant powder. The silver pipe filled with the powder was drawn to have an outer diameter of 1.30 mm$\phi$. The drawn wire was cut into 61 wires.

Ceramic powder having an average grain size of 0.5 $\mu$m and a composition shown in Table 7 to function as a high-resistant body was applied onto one surface of a plate formed of silver and having a thickness of 0.1 mm, and accordingly a plate-shaped body formed of the ceramic powder and the silver was prepared. The plate-shaped body was wound around respective 61 wires, the 61 wires around which the plate-shaped body was wound were bundled to be fit in a silver pipe as a second pipe with an outer diameter and an inner diameter respectively of 14 mm$\phi$ and 13 mm$\phi$. The resultant pipe was drawn to have an outer diameter of 1.25 mm$\phi$. The drawn silver pipe was subjected to a rolling process to have a thickness of 0.25 mm and accordingly a tape-shaped wire was obtained. The tape-shaped wire was heat treated for 50 hours at 845° C., cooled to the room temperature, and subjected to a rolling process to have a thickness of 0.22 mm. The wire was heat treated for 50 hours at 840° C. and thus superconducting wires represented by samples 91–103 were obtained.

The critical current density of the obtained samples 92–103 was measured in liquid nitrogen by the dc-four probe method after the ceramic powder in the wire was removed. The critical current density for sample 91 was measured without changing the state of the obtained wire in the liquid nitrogen by the four-probe method. The result accordingly obtained is shown by Table 7.

TABLE 7

| Sample No. | Ceramic Powder | Critical Current Density (A/cm$^2$) |
| --- | --- | --- |
| 91 | None | 34,000 |
| 92 | Zirconium Oxide (ZrO$_2$) | 18,000 |
| 93 | Manganese Oxide (Mn$_2$O$_3$) | 16,000 |
| 94 | Silicon Nitride (Si$_3$N$_4$) | 4,000 |
| 95 | Silicon Carbide (SiC) | 2,000 |
| 96 | Yttrium Oxide Stabilizing Zirconia (YSZ) | 1,000 |
| 97 | Aluminum Oxide (Al$_2$O$_3$) | 35,500 |
| 98 | Magnesium Oxide (MgO) | 36,000 |
| 99 | Silicon Oxide (SiO$_2$) | 31,000 |
| 100 | Cobalt Oxide (CoO) | 34,500 |
| 101 | Cobalt Tetraoxide (Co$_3$O$_4$) | 34,000 |
| 102 | (Sr, Ca)$_2$CuO$_3$ | 35,500 |
| 103 | Bi$_2$Sr$_2$CuO$_X$ | 36,500 |

It can be seen from Table 7 that the critical current density of samples having the ceramic powder other than that of oxide decreases.

Further, the ac loss of Samples 91 and 97 was measured. The ac sample 97 was 1/10 or less the ac loss of Sample 91.

Figure 4:
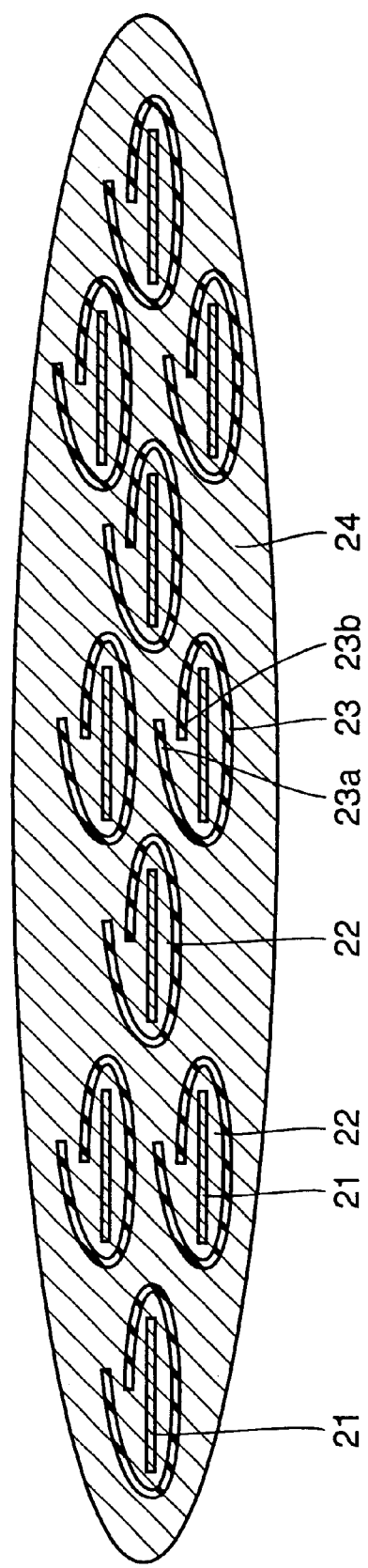
FIG. 4 illustrates a cross section of Sample 97 in Example 7.

Referring to FIG. 4, a bismuth-based high temperature oxide superconductor 21 was coated with a sheathing body 22. Edges 23a and 23b ceramic portion 23 of the plate-shaped body were not in contact with each other. The plate-shaped body was coated with a coating body 24 formed silver.

EXAMPLE 8

Bi$_2$O$_3$, PbO, SrCO$_3$, CaCO$_3$ and CuO were mixed to obtain powder composition ratio (atomic ratio) of Bi:Pb:Sr:Ca:Cu=1.8:0.4:2.0:2.0:3.0. The obtained powder was heat treated for 12 hours at 700° C., and ground by a ball mill. After the ground powder was heat treated for 8 hours at 800° C., the powder was ground by the ball mill. The ground powder was heat treated for 4 hours at 850° C., and thereafter the ball mill.

The obtained powder by the grinding process was heat treated for 2 hours at 800° C. for deaeration, and thereafter a silver pipe as a first pipe having an outer diameter of 25 mmφ and an inner diameter of 22 mmφ was filled with the powder. The silver pipe filled with the powder was drawn to have an outer diameter of 20 mmφ, a silver pipe having an outer diameter of 23 mmφ and an inner diameter of 22 mmφ was filled with the obtained silver pipe together with aluminum oxide (Al$_2$O$_3$) powder having an average grain size of 0.5 μm and functioning as a high-resistant body. The silver pipe thus obtained was drawn to have an outer diameter of 1.44 mmφ to obtain a wire.

The obtained wire was cut into 61 wires, the 61 wires were bundled to be fit in a silver pipe with an outer diameter of 14 mmφ and an inner diameter of 13 mmφ and the silver pipe was subjected to a drawing process to have an outer diameter of 1.25 mmφ, and thus a wire was obtained.

The obtained wire was twisted at a twist pitch of 10 mm, and rolled to have a thickness of 0.25 mm and accordingly a tape-shaped wire was obtained. The resultant tape-shaped wire was heat treated for 50 hours at 845° C., cooled to the room temperature and rolled to have a thickness of 0.22 mm. After the rolling process, the wire was heat treated for 50 hours at 840° C. to obtain a high temperature oxide superconducting wire.

The critical current density of the obtained wire was measured in liquid nitrogen by the dc-four probe method after aluminum oxide was removed. The critical current density of the silver sheath wire having the oxide superconductor coated only with silver similar to the conventional one was also measured in liquid nitrogen by the dc-four probe method. According to the result of the measurement, the critical current density of the silver sheath wire was 33000A/cm$^2$, while the wire of the invention had the critical current density of 32500A/cm$^2$. Accordingly, no difference was recognized therebetween. The ac loss of the wire obtained by following the steps above was measured in liquid nitrogen. The ac loss of the silver sheath wire was also measured in liquid nitrogen. The result of the measurement shows that the ac loss of the wire of the invention is 1/10 of the ac loss of the silver sheath wire.

EXAMPLE 9

Bi$_2$O$_3$, PbO, SrCO$_3$, CaCO$_3$ and CuO were mixed to obtain powder having a composition ratio (atomic ratio) of Bi:Pb:Sr:Ca:Cu=1.8:0.4:2.0:2.0:3.0. The obtained powder was heat treated for 12 hours at 700° C., and thereafter ground by a ball mill. The ground powder was heat treated for 8 hours at 800° C., and thereafter ground by the ball mill. The ground powder was heat treated for 4 hours at 850° C., and thereafter ground by the ball mill.

The powder thus obtained by the grinding process was heat treated for 2 hours at 800° C. for deaeration. After that, a silver pipe as a first pipe with an outer diameter of 25 mmφ and an inner diameter of 22 mmφ was filled with that powder. The silver pipe filled with the powder was drawn to have an outer diameter of 20 mmφ. A silver pipe with an outer diameter and an inner diameter respectively of 23 mm and 22 mm was filled with the resultant silver pipe together with magnesium oxide (MgO) having an average grain size of 0.5 μm and functioning as a high-resistant body, and the resultant silver pipe was drawn to have an outer diameter of 0.44 mmφ.

The wire obtained by the drawing process was cut into 61 wires, the 61 wires were bundled to be fit in a silver pipe with an outer diameter and an inner diameter respectively of 14 mmφ and 13 mmφ, and the obtained silver pipe was drawn to have an outer diameter of 1.25 mmφ. Following a similar step to the step above, 6 wires having an outer diameter of 1.25 mmφ each were prepared. 6 wires were bundled to be subjected to a twining process at a pitch of 70 mm, and a resultant stranded wire was rolled to have a thickness of 0.5 mm to obtain a tape-shaped wire.

The resultant wire was heat treated for 50 hours at 845° C. and thereafter cooled to the room temperature. The tape-shaped wire was rolled to have a thickness of 0.45 mm and thereafter heat treated for 50 hours at 840° C. to obtain a high temperature oxide superconducting wire.

The critical current density of the obtained wire was measured in liquid nitrogen by the dc four-probe method after the magnesium oxide was removed. Further, the conventional silver sheath wire was prepared and the critical current density of the silver sheath wire was measured in liquid nitrogen by the dc four-method. According to the result of the measurement, the critical current density of the silver sheath wire was 35000A/cm$^2$, while the wire of the present invention had the critical current density of 34500A/cm$^2$, and thus there is no difference recognized therebetween.

In addition, the ac loss of the wire of the present invention was measured in liquid nitrogen. The ac loss of the conventional silver sheath wire was also measured in liquid nitrogen. The ac loss of the wire of the present invention was ⅕ the ac loss of the silver sheath wire.

EXAMPLE 10

$Bi_2O_3$, PbO, $SrCO_3$, $CaCO_3$ and CuO were mixed to obtain powder having a composition ratio (atomic ratio) of Bi:Pb:Sr:Ca:Cu=1.8:0.4:2.0:2.0:3.0. The obtained powder was heat treated for 12 hours at 700° C., and ground by a ball mill. The ground powder was heat treated for 8 hours at 800° C., and ground by the ball mill. The ground powder was heat treated for 4 hours at 850° C., and ground by the ball mill.

The ground powder was heat treated for 2 hours at 800° C. for deaeration. After that, an Ag-10 at % Au alloy pipe as a first pipe having an outer diameter of 25 mm$\phi$ and an inner diameter of 22 mm$\phi$ was filled with that powder, and the pipe filled with the powder was drawn to have an outer diameter of 1.30 mm$\phi$ to obtain a wire. The obtained wire was cut into 61 wires.

Aluminum oxide ($Al_2O_3$) powder with an average grain size of 0.8 $\mu$m was used to prepare a cylinder-shaped powder compact with an outer diameter of 12.9 mm$\phi$, and 61 holes having an inner diameter of 1.30 mm$\phi$ each were made inside the powder compact. The 61 wires prepared by the step described above were respectively inserted into the holes, the powder compact to which the wires were inserted was inserted into an Ag-10 at % Au alloy pipe as a second pipe with an outer diameter and an inner diameter respectively of 14 mm$\phi$ and 13 mm$\phi$, and the alloy pipe was drawn to have an outer diameter of 1.25 mm$\phi$ to obtain a wire.

The resultant wire was rolled to have a thickness of 0.25 mm and accordingly a tape-shaped wire was obtained. The tape-shaped wire was heat treated for 50 hours at 845° C., cooled to the room temperature, and thereafter rolled to a thickness of 0.22 mm to obtain a tape-shaped wire. 10 pieces of such tape-shaped wires thus obtained were deposited on each other and heat treated for 50 hours at 840° C. Accordingly, a high temperature oxide superconducting wire lead was obtained.

The amount of inserted heat of the lead thus obtained was measured in a range of temperature from 4.2K to 77.3K. Under the same condition, the amount of inserted heat of the conventional silver sheath wire was measured. The amount of inserted heat of the current lead formed of the conventional silver sheath wire was 0.28 W/kA at 500 A, while the amount of inserted heat of the lead of the invention was 0.05 W/kA at 500 A. The amount of inserted heat can be reduced to ⅕ or less of that of the conventional wire.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a high temperature oxide superconducting wire, comprising the steps of filling a first pipe formed of material containing silver with raw powder which becomes a high temperature oxide superconductor by a heat treatment or powder of said high temperature oxide superconductor;

placing said first pipe filled with said raw powder or said powder of the high temperature oxide superconductor in a second pipe;

filling a space between an outer surface of said first pipe and an inner surface of said second pipe with heat-resistant oxide ceramic powder, said second pipe formed of material which is inactive relative to said heat-resistant oxide ceramic powder in a high temperature oxidative atmosphere; and applying a plastic working and a heat treatment to said second pipe filled with said heat-resistant oxide ceramic powder.

2. The method of manufacturing the high temperature oxide superconducting wire according to claim 1, wherein an average grain size of said heat-resistant oxide ceramic powder is equal to or less than 10 $\mu$m.

3. The method of manufacturing the high temperature oxide superconducting wire according to claim 2, wherein the average grain size of said heat-resistant oxide ceramic powder is equal to or less than 1 $\mu$m.

4. The method of manufacturing the high temperature oxide superconducting wire according to claim 1, wherein conductive metal is evaporated and deposited on a surface of said heat-resistant oxide ceramic powder.

5. The method of manufacturing the high temperature oxide superconducting wire according to claim 1, wherein conductive metal powder is mixed with said heat-resistant oxide ceramic powder.

6. The method of manufacturing the high temperature oxide superconducting wire according to claim 1, wherein said step of applying the plastic working and the heat treatment to said second pipe includes a step of applying a twisting process to said second pipe and thereafter applying a compressing process and the heat treatment to said second pipe.

7. The method of manufacturing the high temperature oxide superconducting wire according to claim 1, wherein said step of applying the plastic working and the heat treatment to said second pipe includes a step of applying a drawing process or a twisting process to said second pipe to produce a plurality of wires, bundling said plurality of wires and applying a twining process thereto, and further applying a compressing process and the heat treatment to the wires.

8. The method of manufacturing the high temperature oxide superconducting wire according to claim 1, wherein said step of filling said first pipe with the raw powder or the powder of the high temperature oxide superconductor includes a step of preparing a plurality of said first pipes and filling each of said plurality of first pipes with said raw powder or said powder of the high temperature oxide superconductor.

9. A method of manufacturing a high temperature oxide superconducting wire as claimed in claim 1, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

10. A method of manufacturing a high temperature oxide superconducting wire as claimed in claim 1, wherein said heat-resistant oxide ceramic powder is selected from the group consisting of $Al_2O_3$ and MgO.

11. A method of manufacturing a high temperature oxide superconducting wire as claimed in claim 2, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

12. A method of manufacturing a high temperature oxide superconducting wire as claimed in claim 3, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

13. A method of manufacturing a high temperature oxide superconducting wire, comprising the steps of:
   filling a first pipe formed of material containing silver with raw powder which becomes a high temperatures oxide superconductor by a heat treatment or powder of said high temperature oxide superconductor;
   preparing a powder compact having a hole from heat-resistant oxide ceramic powder;
   inserting said first pipe filled with said raw powder or said powder of the high temperature oxide superconductor into the hole of said powder compact;
   placing said powder compact in which said first pipe is inserted in a second pipe, said second pipe formed of material which is inactive relative to said heat-resistant oxide ceramic powder in a high temperature oxidative atmosphere; and
   applying a plastic working and a heat treatment to said second pipe in which said powder compact is placed.

14. The method of manufacturing the high temperature oxide superconducting wire according to claim 13, wherein an average grain size of said heat-resistant oxide ceramic powder is equal to or less than 10 μm.

15. The method of manufacturing the high temperature oxide superconducting wire according to claim 14, wherein the average grain size of said heat-resistant oxide ceramic powder is equal to or less than 1 μm.

16. The method of manufacturing the high temperature oxide superconducting wire according to claim 13, wherein conductive metal is evaporated and deposited on a surface of said heat-resistant oxide ceramic powder.

17. The method of manufacturing the high temperature oxide superconducting wire according to claim 13, wherein conductive metal powder is mixed with said heat-resistant oxide ceramic powder.

18. The method of manufacturing the high temperature oxide superconducting wire according to claim 13, wherein said step of applying the plastic working and the heat treatment to said second pipe includes a step of applying a twisting process to said second pipe and thereafter applying a compressing process and the heat treatment to the second pipe.

19. The method of manufacturing the high temperature oxide superconducting wire according to claim 13, wherein said step of applying the plastic working and the heat treatment to said second pipe includes a step of applying a drawing process or a twisting process to said second pipe to produce a plurality of wires, bundling said plurality of wires and applying a twining process thereto, and further applying a compressing process and the heat treatment to the wires.

20. The method of manufacturing the high temperature oxide superconducting wire according to claim 13, wherein said step of filling said first pipe with the raw powder or the powder of the high temperature oxide superconductor includes a step of preparing a plurality of said first pipes and filling each of said plurality of first pipes with said raw powder or said powder of the high temperature oxide superconductor.

21. A method of manufacturing a high temperature oxide superconducting wire as claimed in claim 13, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

22. A method of manufacturing a high temperature oxide superconducting wire as claimed in claim 13, wherein said heat-resistant oxide ceramic powder is selected from the group consisting of $Al_2O_3$ and MgO.

23. A method of manufacturing a high temperature oxide superconducting wire as claimed in claim 15, wherein said heat-resistant oxide ceramic powder is selected from the group consisting of $Al_2O_3$, MgO, CoO, $CO_3O_4$, $SiO_2$, $Bi_2Sr_2CuO_x$ and $(Sr, Ca)_2CuO_3$.

24. A method of manufacturing a high temperature oxide superconducting wire as claimed in claim 16, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

25. A method of manufacturing a high temperature oxide superconducting wire as claimed in claim 17, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

26. A method of manufacturing a high temperature oxide superconducting wire comprising the steps of:
   filling a first pipe formed of material containing silver with raw powder which becomes a high temperature oxide superconductor by a heat treatment or powder of said high temperature oxide superconductor;
   attaching heat-resistant oxide ceramic powder to a surface of a metal plate to produce a plate-shaped body, said metal plate formed of material which is inactive relative to said heat-resistant oxide ceramic powder in a high temperature oxidative atmosphere;
   winding said plate-shaped body around said first pipe filled with said raw powder or said powder of the high temperature oxide superconductor and placing a resultant one in a second pipe, said second pipe formed of material which is inactive relative to said heat-resistant oxide ceramic powder in the high temperature oxidative atmosphere; and
   applying a plastic working and a heat treatment to said second pipe in which said plate-shaped body is placed.

27. The method of manufacturing the high temperature oxide superconducting wire according to claim 26, wherein an average grain size of said heat-resistant oxide ceramic powder is equal to or less than 10 μm.

28. The method of manufacturing the high temperature oxide superconducting wire according to claim 27, wherein the average grain size of said heat-resistant oxide ceramic powder is equal to or less than 1 μm.

29. The method of manufacturing the high temperature oxide superconducting wire according to claim 26, wherein conductive metal is evaporated and deposited on a surface of said heat-resistant oxide ceramic powder.

30. The method of manufacturing the high temperature oxide superconducting wire according to claim 26, wherein conductive metal powder is mixed with said heat-resistant oxide ceramic powder.

31. The method of manufacturing the high temperature oxide superconducting wire according to claim 26, wherein said step of applying the plastic working and the heat treatment to said second pipe includes a step of applying a twisting process to said second pipe and thereafter applying a compressing process and the heat treatment to the second pipe.

32. The method of manufacturing thigh temperature oxide superconducting wire according to claim 26, wherein
said step of applying the plastic working and the heat treatment to said second pipe includes a step of applying a drawing process or a twisting process to said second pipe to produce a plurality of wires, bundling said plurality of wires and applying a twining process thereto, and further applying a compressing process and the heat treatment to the wires.

33. The method of manufacturing the high temperature oxide superconducting wire according to claim 26, wherein
said step of filling said first pipe with the raw powder or the powder of the high temperature oxide superconductor includes a step of preparing a plurality of said first pipes and filling each of said plurality of first pipes with said raw powder or said powder of the high temperature oxide superconductor.

34. A method of manufacturing a high temperature oxide superconducting wire as claimed in claim 26, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

35. A method of manufacturing a high temperature oxide superconducting wire as claimed in claim 28, wherein said heat-resistant oxide ceramic powder is selected from the group consisting of $Al_2O_3$ and MgO.

36. A method of manufacturing a high temperature oxide superconducting wire as claimed in claim 28, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

37. A method of manufacturing a high temperature oxide superconducting wire as claimed in claim 29, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

38. A method of manufacturing a high temperature oxide superconducting wire as claimed in claim 30, wherein said heat-resistant oxide ceramic powder is selected from the group consisting of $Al_2O_3$, MgO, CoO, $Co_3O_4$, $SiO_2$, $Bi_2Sr_2CuO_x$ and $(Sr, Ca)_2CuO_3$.

* * * * *

UNITED STATES PATENT AND TRADEMARK OFFICE
CERTIFICATE OF CORRECTION

PATENT NO. : 6,311,385 B1
DATED : November 6, 2001
INVENTOR(S) : Ueyama et al.

It is certified that error appears in the above-identified patent and that said Letters Patent is hereby corrected as shown below:

<u>Title page,</u>
Item [73], Assignee information should read as follows:

[73] Assignee: Sumitomo Electric Industries, Ltd., Osaka (JP)

Signed and Sealed this

Seventh Day of May 2002

*Attest:*

*Attesting Officer*

JAMES E. ROGAN
*Director of the United States Patent and Trademark Office*